(12) United States Patent
Suzuki

(10) Patent No.: US 7,968,404 B2
(45) Date of Patent: Jun. 28, 2011

(54) SEMICONDUCTOR DEVICE AND FABRICATION METHOD THEREFOR

(75) Inventor: Seiichi Suzuki, Aizuwakamatsu (JP)

(73) Assignee: Spansion LLC, Sunnyvale, CA (US)

( * ) Notice: Subject to any disclaimer, the term of this patent is extended or adjusted under 35 U.S.C. 154(b) by 137 days.

(21) Appl. No.: 11/361,630

(22) Filed: Feb. 24, 2006

(65) Prior Publication Data

US 2006/0263989 A1  Nov. 23, 2006

Related U.S. Application Data

(63) Continuation of application No. PCT/JP2005/003213, filed on Feb. 25, 2005.

(51) Int. Cl.
*H01L 21/336* (2006.01)
(52) U.S. Cl. ........................................ 438/257
(58) Field of Classification Search .................. 438/257
See application file for complete search history.

(56) References Cited

U.S. PATENT DOCUMENTS

| | | | |
|---|---|---|---|
| 6,232,181 B1 | 5/2001 | Lee | |
| 6,271,088 B1 | 8/2001 | Liu et al. | |
| 6,828,623 B1 | 12/2004 | Guo et al. | |
| 7,423,312 B1* | 9/2008 | Torii | 257/315 |
| 2003/0109117 A1* | 6/2003 | Takahashi et al. | 438/526 |
| 2003/0141532 A1* | 7/2003 | Kato | 257/304 |
| 2004/0071030 A1 | 4/2004 | Goda et al. | |
| 2004/0079984 A1* | 4/2004 | Kao et al. | 257/315 |
| 2004/0082198 A1* | 4/2004 | Nakamura et al. | 438/787 |
| 2004/0110390 A1 | 6/2004 | Takagi et al. | |
| 2004/0252541 A1 | 12/2004 | Yang et al. | |
| 2005/0006694 A1 | 1/2005 | Liu | |
| 2005/0014338 A1* | 1/2005 | Kim et al. | 438/275 |
| 2006/0131613 A1 | 6/2006 | Kim et al. | |

FOREIGN PATENT DOCUMENTS

| | | |
|---|---|---|
| DE | 10246343 A1 | 4/2004 |
| JP | 11-186528 | 7/1999 |
| JP | 2003-224213 | 8/2003 |
| JP | 2004-039866 | 2/2004 |
| JP | 2004-111737 | 4/2004 |
| JP | 2004-193178 | 7/2004 |
| JP | 2004-349312 | 12/2004 |

OTHER PUBLICATIONS

Eitan et al.; "NRON: A Novel Localized Trapping, w-0Bit Nonvolatile Mrmory Cell"; IEEE Electron Device Letters, vol. 21, No. 11, Nov. 2000.

* cited by examiner

*Primary Examiner* — David Vu
*Assistant Examiner* — Brandon Fox

(57) ABSTRACT

A semiconductor device is provided which includes a semiconductor substrate (10), an ONO film (16) provided on the semiconductor substrate (10), and a bit line (14) formed in the semiconductor substrate (10) and connected to a contact (34) provided on the bit line (14), the semiconductor substrate (10) having trench isolation regions (50) provided at both sides of the bit line (14), the contact (34) being interposed between the trench isolation regions (50). Accordingly, even if the bit line (14) and the contact (34) is overlapped in a misaligned manner in a direction vertical to the bit line (14), the leakage current does not flow between the bit line (14) and the semiconductor substrate (10) via the contact (34), because the contact (34) is formed on the trench isolation region (50). This makes it possible to make the overlapping margin of the bit line (14) and the contact (34) large, thereby providing a semiconductor device in which the memory cell can be downsized.

15 Claims, 13 Drawing Sheets

PERIPHERAL CIRCUIT REGION           MEMORY CELL REGION

PERIPHERAL CIRCUIT REGION           MEMORY CELL REGION

PERIPHERAL CIRCUIT REGION            MEMORY CELL REGION

SEMICONDUCTOR DEVICE AND FABRICATION METHOD THEREFOR

CROSS-REFERENCES TO RELATED APPLICATIONS

This is a continuation of International Application No. PCT/JP2005/003213, filed Feb. 25, 2005 which was not published in English under PCT Article 21(2).

BACKGROUND OF THE INVENTION

1. Field of the Invention

This invention generally relates to semiconductors and fabrication methods therefor and, more particularly, to a semiconductor device having an Oxide Nitride Oxide (ONO) film and a fabrication method for the same.

2. Description of the Related Art

In recent years, non-volatile memory semiconductor devices, in which data is rewritable, have been widely used. In the technical field of such non-volatile memories, developments downsizing the memory cells are being promoted to obtain higher storage capacity.

As non-volatile memories, floating-gate flash memories, in which the charge is stored in a floating gate, have been widely used. However, when the memory cell is downsized to realize high memory density in recent years, the internal voltage must necessarily be lowered, resulting in a requirement to reduce the thickness of the tunnel oxide film thereof. However, reducing the thickness of the tunnel oxide film increases the leakage current flowing across such film. In addition, defects introduced into the tunnel oxide film cause a problem in reliability that results in loss of the charge stored in the floating gate.

To address this problem, there have been developed flash memories having an Oxide/Nitride/Oxide (ONO) film such as a Metal Oxide Nitride Oxide Silicon (MONOS) or Silicon Oxide Nitride Oxide Silicon (SONOS). These are a type of flash memory in which the charge is stored in silicon nitride film, also known as a trapping layer, interposed between two silicon oxide films. In this type of flash memory, the charge is stored in the silicon nitride film which serves as an insulating film. Therefore, even if there is a defect in the tunnel oxide film, charge loss is minimized, unlike floating-gate type flash memories. A flash memory having an ONO film is described in, for example, Boaz Eitan et al., Electron Device Letters, Vol. 21, No. 11, pp. 543-545(2000) (hereinafter referred to as Non-Patent Document 1).

A description will next be given, with reference to FIG. 1 through FIG. 4, of a flash memory having a conventional ONO film and the fabrication method thereof (hereinafter, referred to as a conventional technique). The flash memory includes a memory cell region and a peripheral circuit region. FIG. 1 is a top view of the memory cell region in accordance with the conventional technique (a protection film 32, an interlayer insulating film 30, an interconnection 34, and an ONO film 16 are not shown), and FIG. 2 is an enlarged view of FIG. 1. FIG. 3 is a cross-sectional view taken along a line A-A' shown in FIG. 2. FIG. 4 is a cross-sectional view taken along a line B-B' shown in FIG. 2. A bit line 14 is provided in a given region of a P-type silicon semiconductor substrate 10. As the ONO film 16, there are provided a silicon oxide film serving as the tunnel oxide film, a silicon nitride film serving as the trapping layer, and another silicon oxide film serving as the top oxide film, on the semiconductor substrate 10. A polysilicon film is formed in a given region on the ONO film 16 as a word line 20 to be a gate of a core cell.

In a bit line connecting region 42, the bit line 14 and the interconnection 34 are connected via a contact hole 40 provided in the interlayer insulating film 30. One bit line connecting region 42 is provided at intervals of multiple word lines 20. To downsize the memory cell, the distance between the bit lines must be narrowed and the distance between the word lines, including the bit line connecting region 42, must also be narrowed.

The conventional technique, however, has a problem in that the distance between the bit lines are hard to downsize because the overlapping margin of the bit line 14 and the contact hole 40 has to be ensured during exposure. Referring now to FIG. 5, a description will be given of a related problem caused by a misaligned overlapping of the bit line 14 and the contact hole 40 during exposure in a direction vertical to the bit line 14. FIG. 5 is a view showing a case where the contact hole 40 is not aligned with the bit line 14 in a left-hand direction. In a region represented by a reference numeral 55, the contact hole 40 is in touch with the P-type silicon semiconductor substrate 10. This contact in the region 55 allows leakage current to flow between the bit line 14 and the semiconductor substrate 10 via the contact hole 40. To prevent this leakage, an overlapping margin of the bit line 14 and the contact hole 40 during exposure is assured and then the width of the bit line 14 and the distance between the bit lines 14 are determined. Yet, assuring the overlapping margin makes it difficult to decrease the distance between the bit lines 14.

SUMMARY OF THE INVENTION

It is an object of the present invention to provide a semiconductor device and a fabrication method therefor so that a leakage current can be suppressed between the bit line and the connecting hole, the leakage current being a current flowing when the bit line and the connecting hole is overlapped in a misaligned manner in a direction vertical to the bit line, and the overlapping margin of the bit line and the connecting hole can be made large, thereby downsizing the memory cell.

According to an aspect of the present invention, preferably, there is provided a semiconductor device including a semiconductor substrate, an ONO film provided on the semiconductor substrate, and a bit line formed in the semiconductor substrate and connected to a contact provided on the bit line, the semiconductor substrate having trench isolation regions provided at both sides of the bit line, the contact being interposed between the trench isolation regions. According to the present invention, even if the bit line and the contact is overlapped in a misaligned manner in a direction vertical to the bit line, the leakage current does not flow between the bit line and the semiconductor substrate via the contact, because the contact is formed on the trench isolation region. This makes it possible to make the overlapping margin of the bit line and the contact large, thereby providing a semiconductor device in which the memory cell can be downsized.

According to another aspect of the present invention, preferably, there is provided a method of fabricating a semiconductor device comprising the steps of forming trench isolation regions in a semiconductor substrate, forming a bit line in the semiconductor substrate, providing an ONO film on the semiconductor substrate, and forming a contact connected to the bit line, the contact being interposed between the trench isolation regions provided at both sides of the bit line. According to the present invention, even if the bit line and the contact is overlapped in a misaligned manner in a direction vertical to the bit line, the leakage current does not flow between the bit line and the semiconductor substrate via the contact because the contact is formed on the trench isolation region. This makes it possible to make the overlapping margin of the bit line and the contact large, thereby providing a semiconductor device in which the memory cell can be downsized.

DESCRIPTION OF THE PREFERRED EMBODIMENTS

A description will now be given, with reference to the accompanying drawings, of embodiments of the present invention.

First Embodiment

A description will first be given, with reference to FIG. 6 through FIG. 14, of a semiconductor device and fabrication method therefor in accordance with a first embodiment of the present invention.

First, a trench isolation region 50 is formed in a given region on a P-type silicon semiconductor substrate 10 (or a P-type semiconductor region formed in the semiconductor substrate), with the use of a Shallow Trench Isolation (STI) technique. The trench isolation region is a region wherein a groove (trench) portion is formed on the semiconductor substrate 10 and an oxide film such as a silicon oxide film is formed and buried into the groove portion. The trench isolation region 50, for example, is formed as follows. A given region of the semiconductor substrate 10 is dry etched for forming the groove portion. Then, the silicon oxide film is deposited on the whole surface by a thermal oxidation process or a chemical vapor deposition (CVD) process. Planarization is performed by Chemical Mechanical Polish (CMP) or selective etch processing. The silicon oxide film is thus buried into the groove portion, and the trench isolation region is formed.

Figure 1:
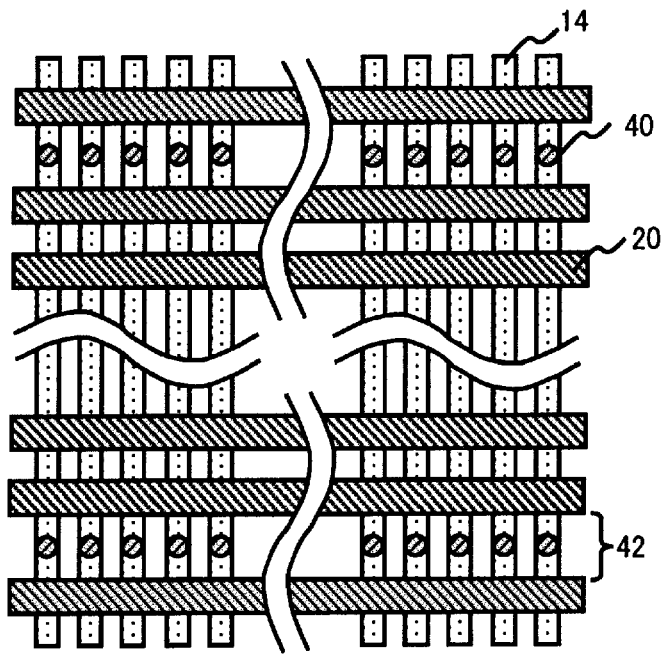
FIG. 1 is a first top view of a semiconductor device in accordance with a conventional technique.
Figure 2:
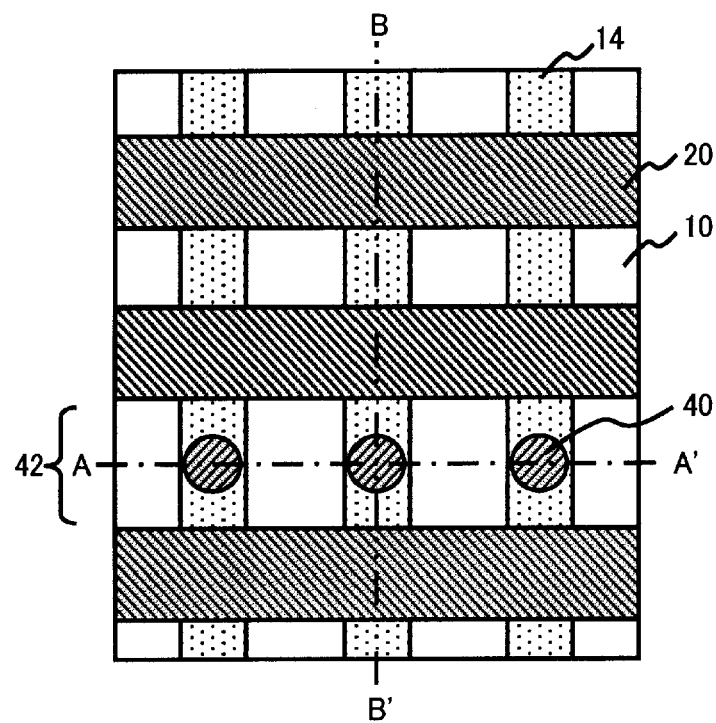
FIG. 2 is a second top view of the semiconductor device in accordance with the conventional technique.
Figure 3:
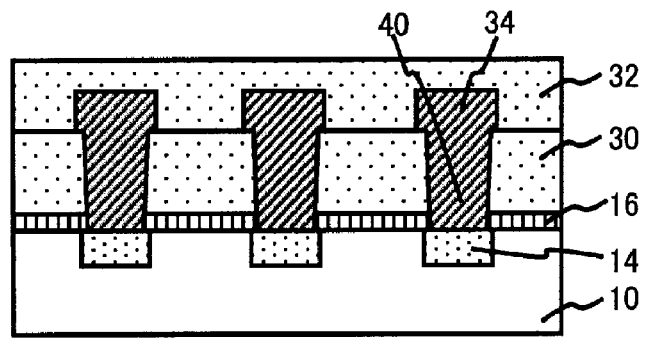
FIG. 3 is a first cross-sectional view of the semiconductor device in accordance with the conventional technique.
Figure 4:
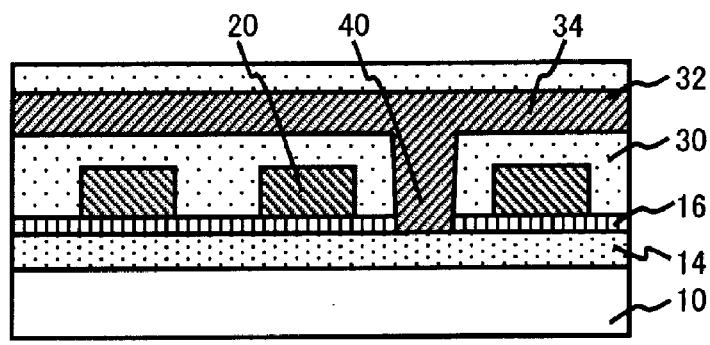
FIG. 4 is a second cross-sectional view of the semiconductor device in accordance with the conventional technique.
Figure 5:
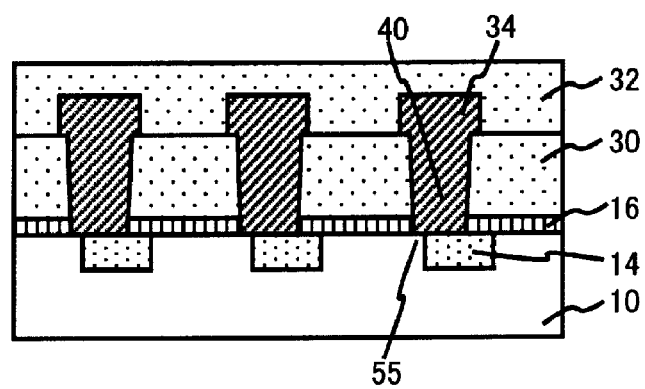
FIG. 5 is a cross-sectional view illustrating the problem of semiconductor devices in accordance with the conventional technique.
Figure 6:
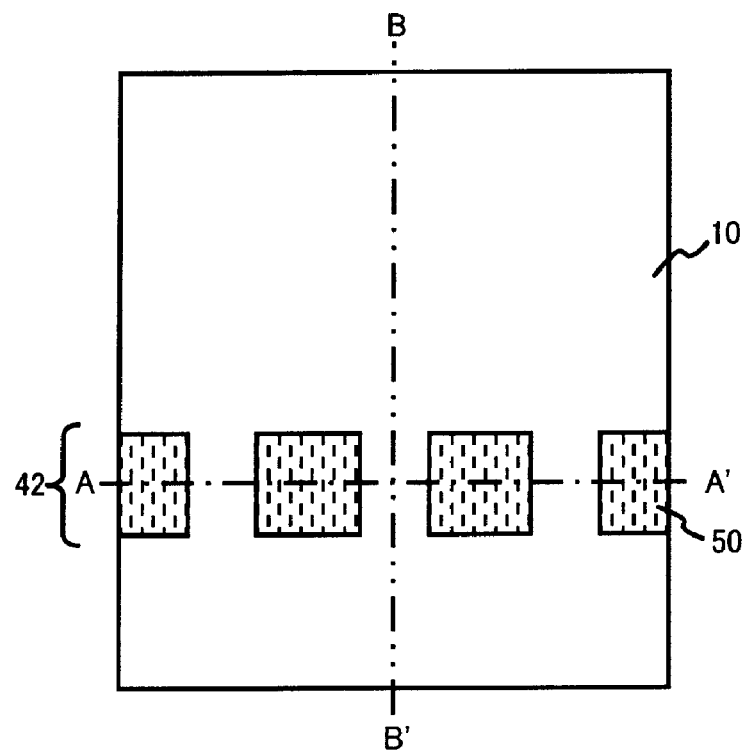
FIG. 6 is a first top view showing a fabrication process in accordance with a first embodiment of the present invention.
Figure 7:
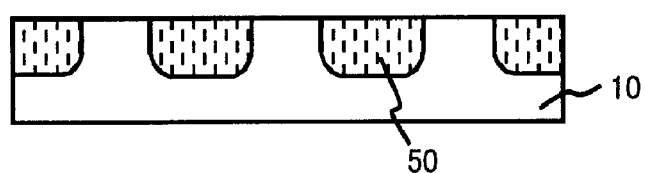
FIG. 7 is a first cross-sectional view showing the fabrication process in accordance with a first embodiment of the present invention.
Figure 8:
FIG. 8 is a second cross-sectional view showing the fabrication process in accordance with the first embodiment of the present invention.

FIG. 6 is a top view of the memory cell subsequent to the formation of the trench isolation region 50. FIG. 7 is a cross-sectional view taken along a line A-A' shown in FIG. 6. FIG. 8 is a cross-sectional view taken along a line B-B' shown in FIG. 6. The trench isolation regions 50 are formed between the bit lines in the bit line connecting region 42, in which the connecting holes are to be provided. The formation of the trench isolation region 50 is performed simultaneously with the trench isolation region arranged in the peripheral circuit region, thereby enabling the fabrication process to be simplified.

Figure 9:
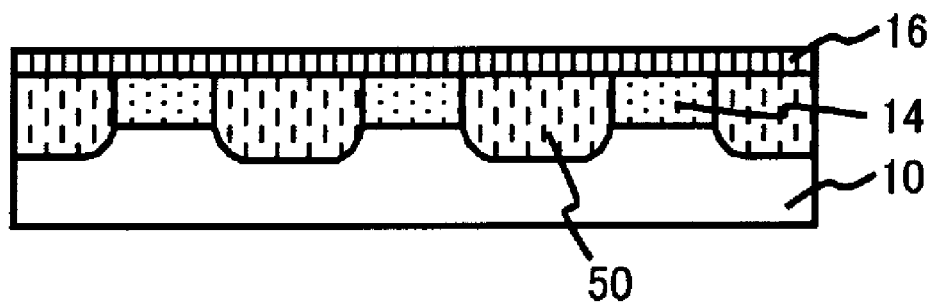
FIG. 9 is a third cross-sectional view showing the fabrication process in accordance with the first embodiment of the present invention.

Next, referring to FIG. 9, as the ONO film 16, there is provided a silicon oxide film serving as the tunnel oxide film, a silicon nitride film serving as the trapping layer, and another silicon oxide film serving as the top oxide film, on the semiconductor substrate 10, by the thermal oxidation process or CVD process.

And, for example, arsenic ions are implanted into a given region of the semiconductor substrate 10 and the thermal process is performed to subsequently form the bit line 14 of an N-type semiconductor layer.

Figure 10:
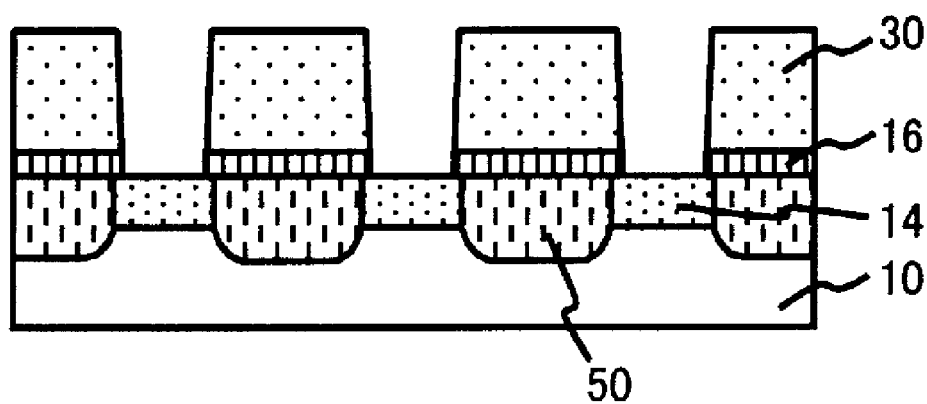
FIG. 10 is a fourth cross-sectional view showing the fabrication process in accordance with the first embodiment of the present invention.
Figure 11:
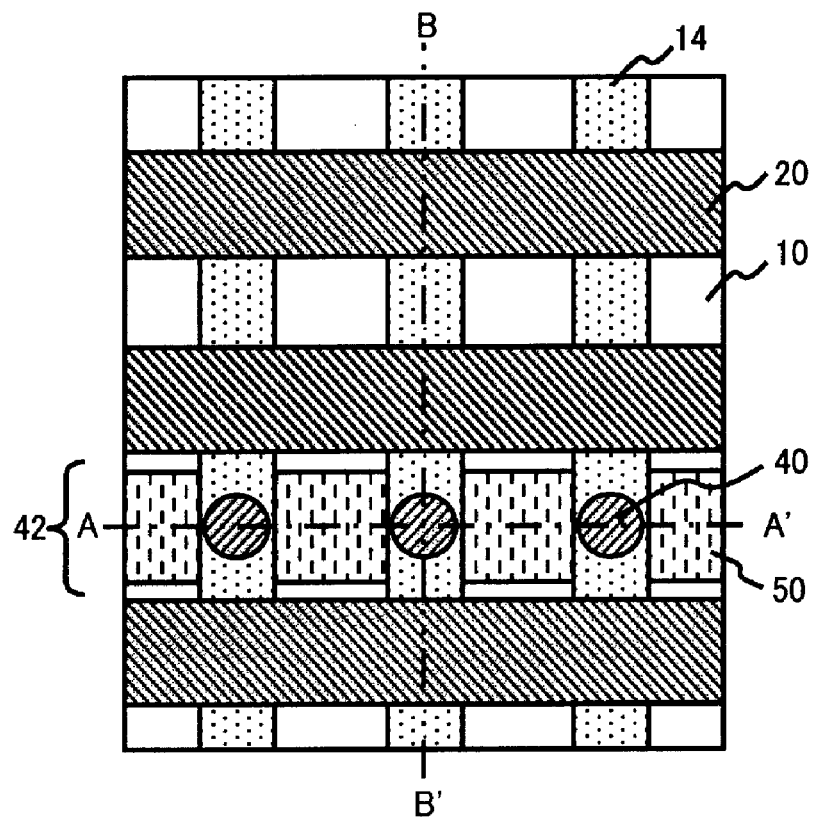
FIG. 11 is a fifth cross-sectional view showing the fabrication process in accordance with the first embodiment of the present invention.
Figure 12:
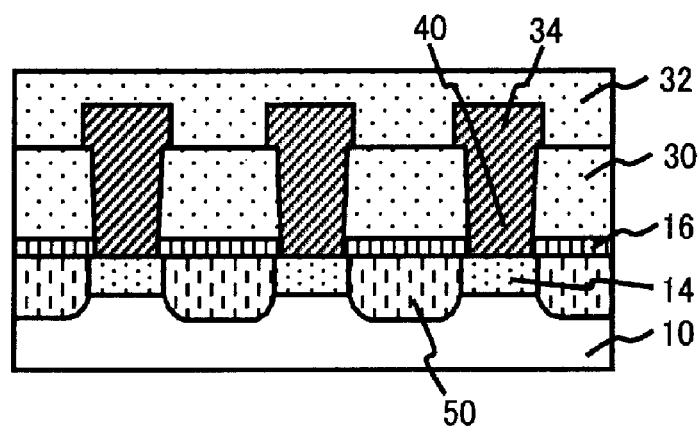
FIG. 12 is a second top view showing the fabrication process in accordance with the first embodiment of the present invention.
Figure 13:
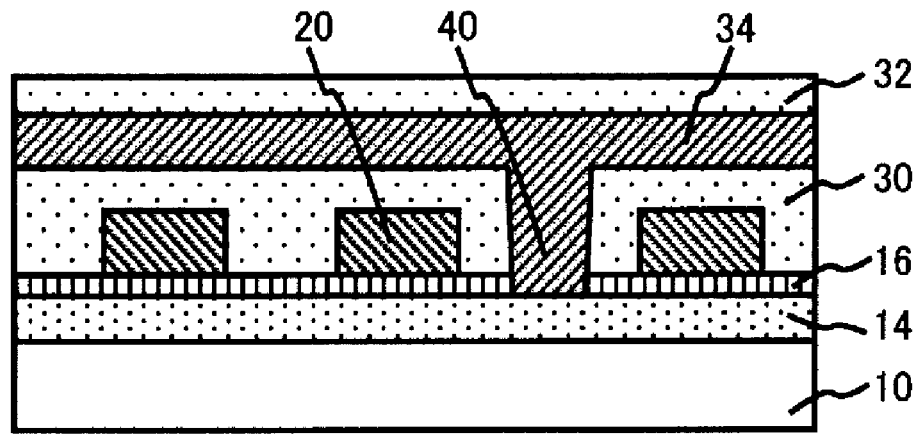
FIG. 13 is a sixth cross-sectional view showing the fabrication process in accordance with the first embodiment of the present invention.

Next, referring to FIG. 10, a silicon oxide film such as Boron-Phosphorus Silicated Glass (BPSG) or the like, for example, is deposited on the transistor as the interlayer insulating film 30. A connecting hole 40 (a contact that electrically connects the bit line 14) is formed in the bit line connecting region 42 of the interlayer insulating film 30. FIG. 11 is a top view (the interlayer insulating film 30, and the ONO film 16 are not shown). FIG. 12 is a cross-sectional view taken along a line A-A' shown in FIG. 11. The interconnection 34 is formed with the use of, for example, aluminum alloy, to bury the contact hole 40. The protection film 32 is fabricated of silicon oxide film, for example, and the memory cell is thus completed. FIG. 13 is a cross-sectional view taken along a line B-B' shown in FIG. 11. For the word line 20 to work as the gate of the core cell, it is formed with a polysilicon film and a given region is etched. Then, a multilayer structure having a silicide may be used with the polysilicon film to reduce the resistance of the word line. As shown in FIG. 11, the trench isolation regions 50 are arranged at both sides of the bit lines 14 and are formed to sandwich the respective connecting holes 40 from both sides thereof. In addition, the trench isolation regions 50 are arranged between adjacently arranged word lines 20. Multiple trench isolation regions 50 are arranged in a shape of a line along the word line 20. There are no trench isolation regions 50 formed between the word lines 20, in which the connecting holes 40 are not provided.

Figure 14:
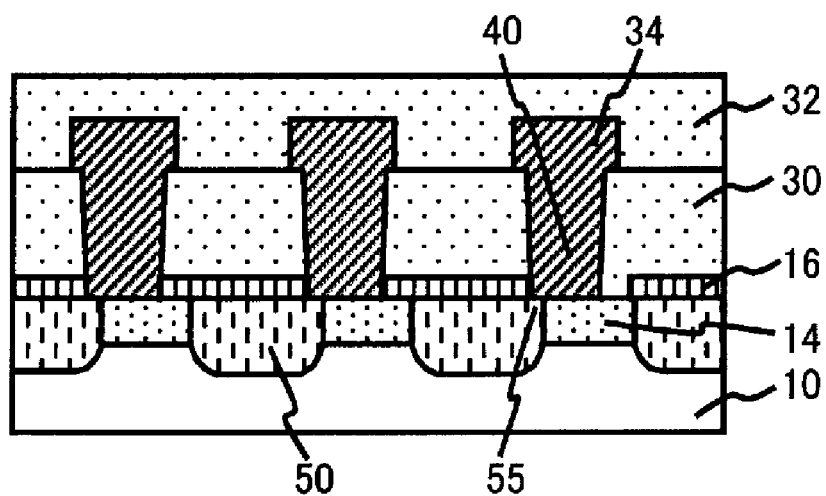
FIG. 14 is a seventh cross-sectional view showing the fabrication process in accordance with the first embodiment of the present invention.

FIG. 14 is a cross-sectional view along the line A-A' shown in FIG. 11 wherein the contact hole 40 is not aligned on the bit line 14 in a left-handed direction. Even if the contact hole 40 is formed away from the bit line 14 in the region 55, the contact hole 40 is formed on the trench isolation region 50. For this reason, the semiconductor substrate 10 and the contact hole 40 are not electrically connected and leakage current does not flow. Therefore, the overlapping margin of the bit line 14 and the contact hole 40 during exposure can be made large, thereby allowing the memory cell to be downsized.

Second Embodiment

A description will now be given, with reference to FIG. 15 through FIG. 23, of a fabrication method of a semiconductor device in accordance with a second embodiment of the present invention.

Figure 15:
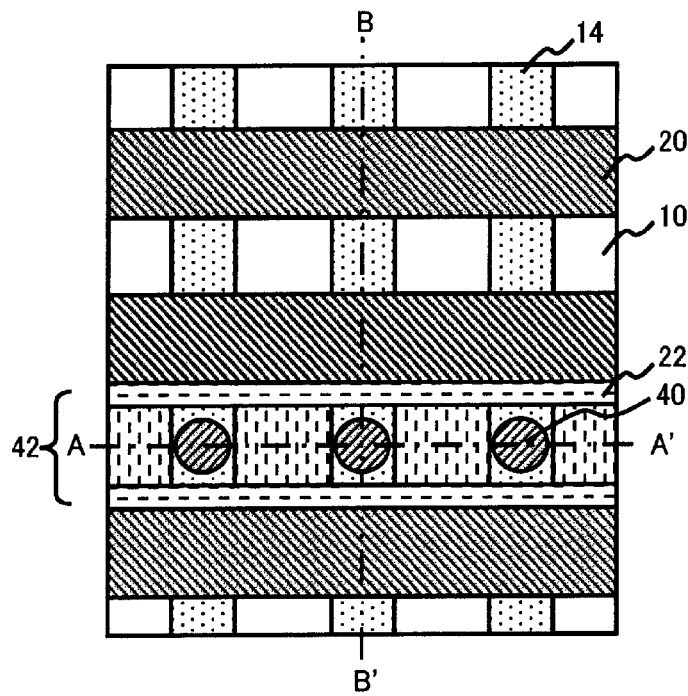
FIG. 15 is a cross-sectional view illustrating an effect in accordance with the first embodiment of the present invention.

FIG. 15 is a top view of the semiconductor device when the fabrication is completed (the protection film 32, the interlayer insulating film 30, the ONO film 16 are not shown). FIG. 16 through FIG. 22 are cross-sectional views taken along a line B-B' (shown in FIG. 15) during the fabrication process in accordance with the second embodiment. The memory cell region is shown on the right and a region around the gate in the peripheral circuit region is shown on the left.

Figure 16:
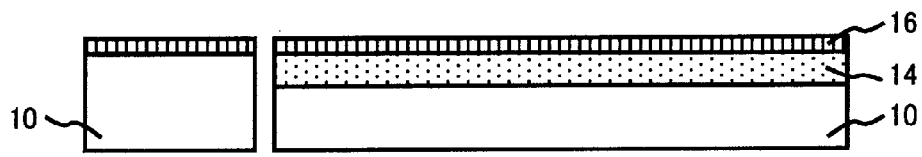
FIG. 16 is a top view showing the fabrication process in accordance with a second embodiment of the present invention.

First, FIG. 16 is a cross-sectional view subsequent to processing steps as shown in FIG. 7 through FIG. 9 in accordance with the first embodiment. In the memory cell region, the ONO film 16 is formed on the semiconductor substrate 10 having the bit line 14. In the peripheral circuit region, the ONO film 16 is formed on the semiconductor substrate 10.

Figure 17:
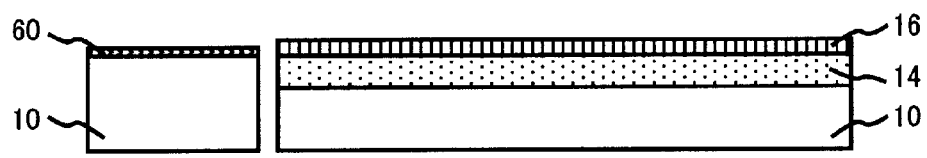
FIG. 17 is a first cross-sectional view showing the fabrication process in accordance with the second embodiment of the present invention.

In FIG. 17, the ONO film is selectively removed in the peripheral circuit region and a silicon oxide film is formed as the gate oxide film 60.

Figure 18:
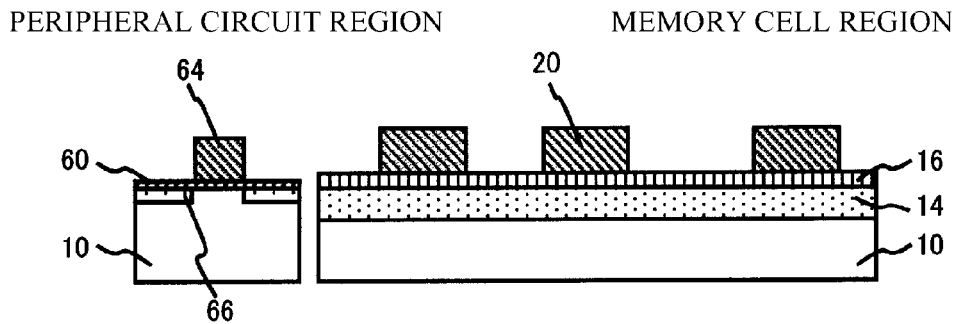
FIG. 18 is a second cross-sectional view showing the fabrication process in accordance with the second embodiment of the present invention.

Next, in FIG. 18, in the memory cell region, the word line 20 to serve as the gate in the core cell is formed by using, for example, polysilicon and, in the peripheral circuit region, a gate 64 is formed by using, for example, polysilicon. At this time, the fabrication process can be simplified by forming the word line 20 and the gate 64 simultaneously. Then, for example, arsenic ions are implanted to form an N-type region 66, which is relatively lightly doped and shallow, on both sides of the gate 64 in the peripheral circuit region.

Figure 19:
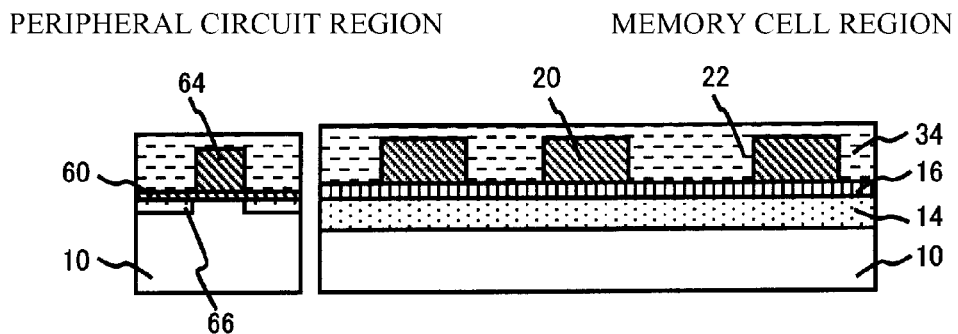
FIG. 19 is a third cross-sectional view showing the fabrication process in accordance with the second embodiment of the present invention.
Figure 20:
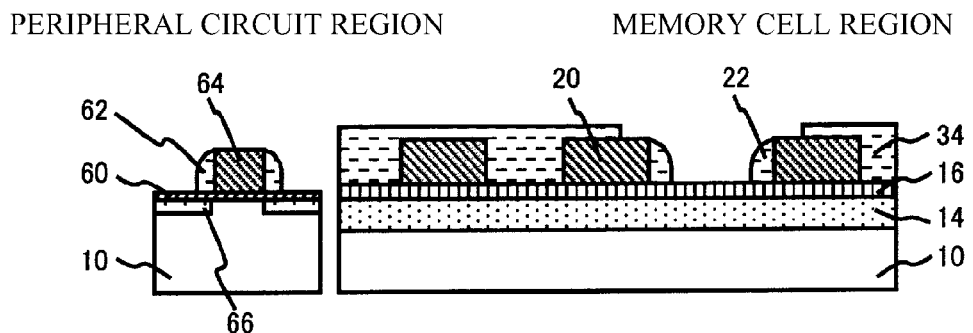
FIG. 20 is a fourth cross-sectional view showing the fabrication process in accordance with the second embodiment of the present invention.
Figure 21:
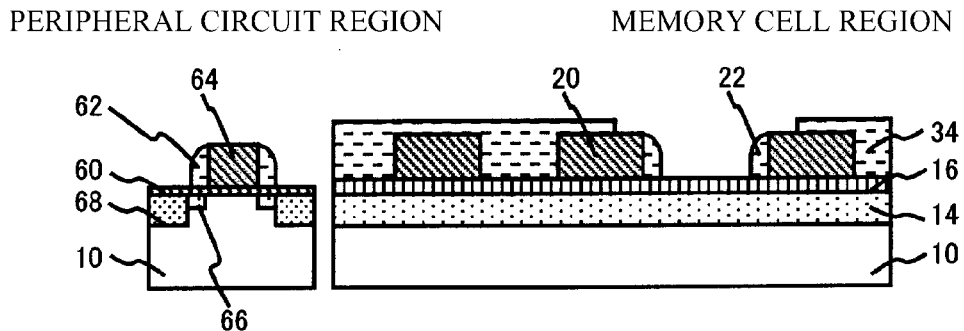
FIG. 21 is a fifth cross-sectional view showing the fabrication process in accordance with the second embodiment of the present invention.

Next, in FIG. 19, a silicon nitride film 22 is deposited by CVD. Then, in FIG. 20, the bit line connecting region 42 is selectively and anisotropically etched in the peripheral circuit region and in the memory cell region. Thus, sidewalls 62 for Lightly Doped Drain (LDD) are arranged on both sides of the gate 64 and sidewalls 22 are arranged on a side of the bit line connection region 42 of the word line 20. Then, referring to FIG. 21, arsenic ions, for example, are implanted to form an N-type region 68, which is relatively heavily doped, on both sides of the sidewalls 62 for LDD. Thus, the LDD architecture is constructed in the peripheral circuit region.

Figure 22:
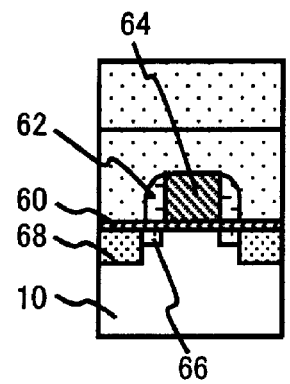
FIG. 22 is a sixth cross-sectional view showing the fabrication process in accordance with the second embodiment of the present invention.
Figure 22:
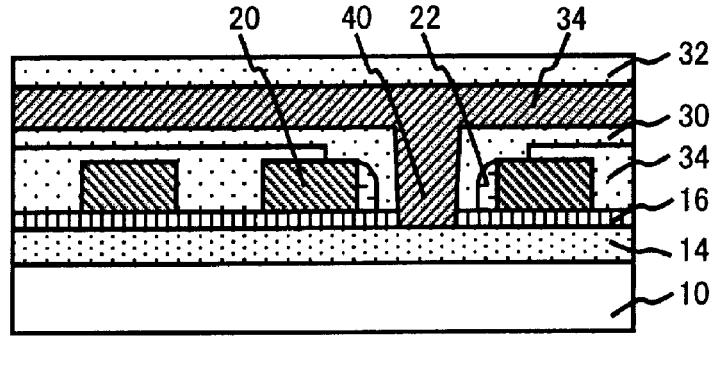
Figure 23:
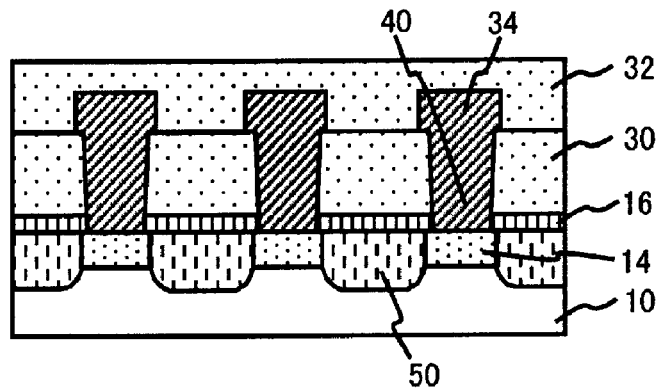
FIG. 23 is a seventh cross-sectional view showing the fabrication process in accordance with the second embodiment of the present invention.

Next, in FIG. 22, for example, a silicon oxide film such as BPSG or the like is formed on the transistor as the interlayer insulating film 30. The contact hole 40 is created in the bit line connecting region 42 of the interlayer insulating film 30 so as to connect the bit line. The interconnection 34 is fabricated of aluminum alloy to bury the contact hole 40. The protection film 32 is formed with, for example, the silicon oxide film, completing the memory cell and the peripheral circuit region. From another angle, FIG. 23 is a cross-sectional view after completion of the memory cell and the peripheral circuit region taken along a line A-A' shown in FIG. 15.

Figure 24:
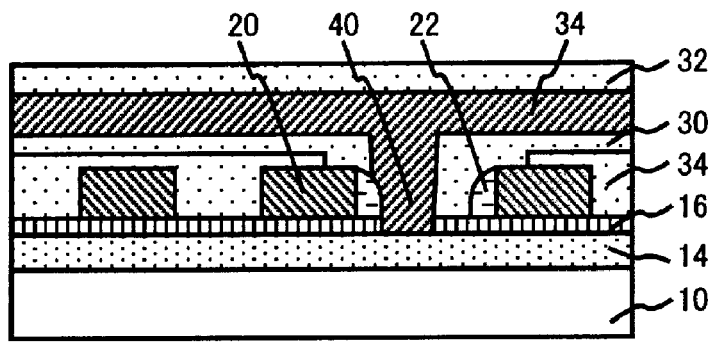
FIG. 24 is a cross-sectional view illustrating an effect in accordance with the second embodiment of the present invention.

FIG. 24 is a cross-sectional view taken along a line B-B' in a case where the contact hole 40 is misaligned in a direction parallel to the bit line. The word line 20 can be protected from dry etching at the time of forming the contact hole 40 by maintaining the etch selectivity of the interlayer insulating film 30 and the sidewalls 22. This makes it possible to increase the overlapping margin of the word line 20 and the contact hole 40 during exposure, allowing the memory cell to be downsized. In addition, the sidewalls 22 and the sidewalls 62 for LDD are formed simultaneously, enabling simplification of the fabrication process.

Third Embodiment

Figure 25:
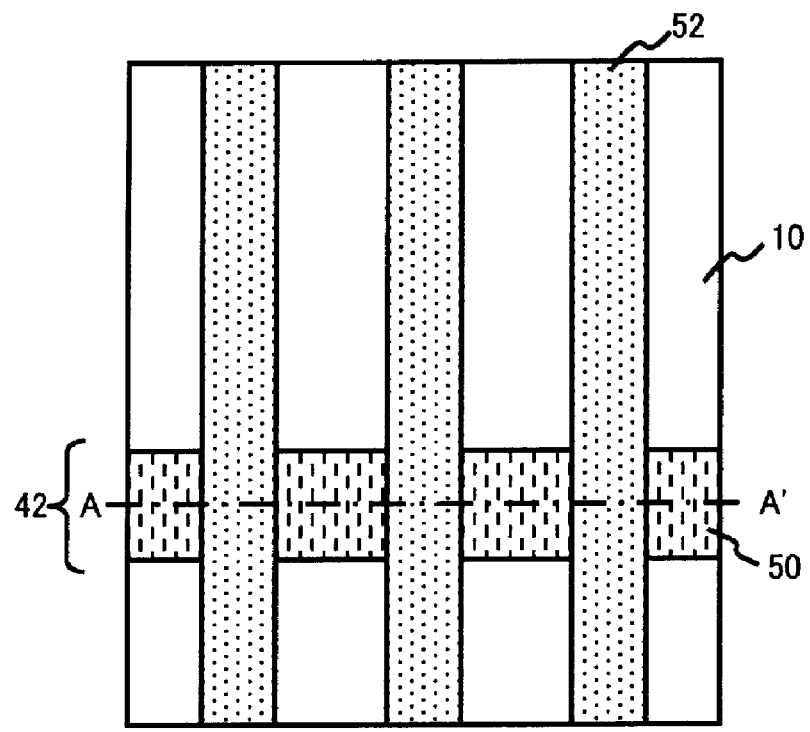
FIG. 25 shows a layout in accordance with the first embodiment of the present invention.

A third embodiment of the present invention describes an example relating to a region in which the bit line is formed. First, possible shortcomings of the first embodiment will be discussed. FIG. 25 shows a region for trench isolation region 50 and a region 52 in which ions are implanted to form the bit line 14 in the memory cell in accordance with the first embodiment of the present invention.

Figure 26:
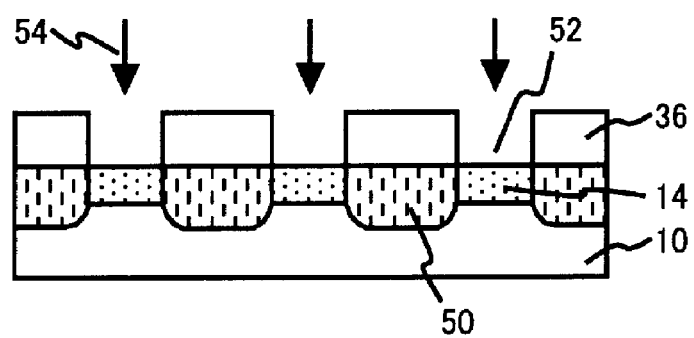
FIG. 26 is a cross-sectional view illustrating ion implantation in accordance with the first embodiment of the present invention.

FIG. 26 is a cross-sectional view of the ion implantation process for forming the bit line 14 taken along a line A-A' shown in FIG. 25. There are provided openings for the region 52 on a photoresist 36 for ion implantation. For example, arsenic is used for ion implantation. The ions are implanted onto the openings of the regions 52 in order to form the bit line 14. Subsequently, the N-type bit line 14 is formed by the thermal treatment.

Figure 27:
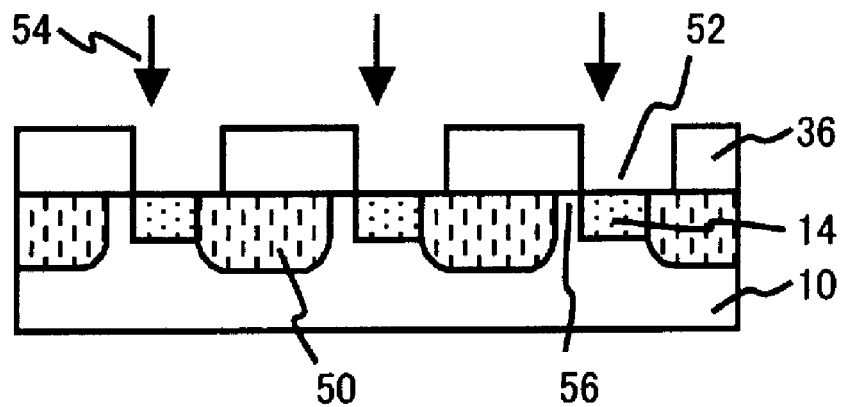
FIG. 27 is a cross-sectional view illustrating ion implantation process when the bits line is overlapped in a misaligned manner in accordance with the first embodiment of the present invention.

Next, FIG. 27 is a cross-sectional view of an ion implantation process in a case where the region for the trench isolation region 50 and the region 52 into which ions are implanted are overlapped in a misaligned manner in a direction vertical to the bit line. The region 52 into which ions are implanted is formed in a misaligned manner relative to the region for the trench isolation region 50 in a right-hand direction. If the ions are implanted in this state, a gap portion 56 will be created between the trench isolation region 50 and the bit line 14.

Figure 28:
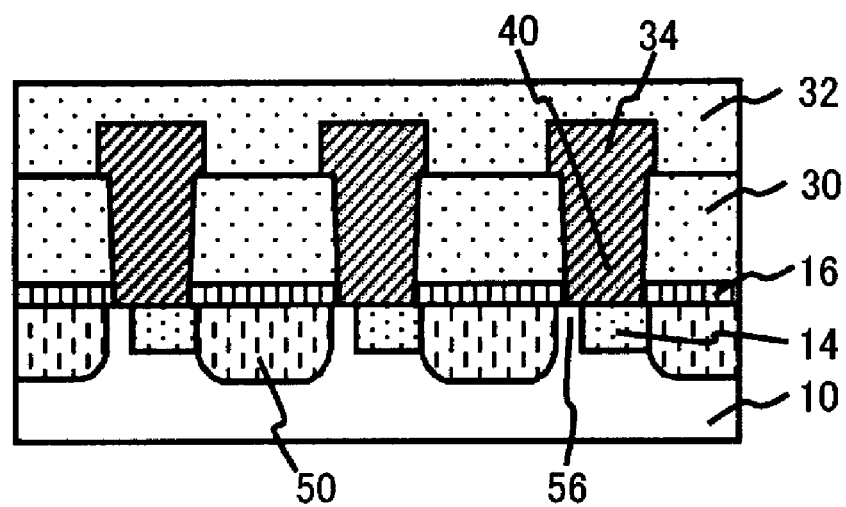
FIG. 28 is a cross-sectional view illustrating the bits line overlapped in a misaligned manner in accordance with the first embodiment of the present invention.

FIG. 28 is a view showing a case where the contact hole 40 is formed in the afore-mentioned state. The contact hole 40 is in contact with the gap portion 56. For this reason, an electrical connection is made in the gap portion 56, which is interposed between the semiconductor substrate 10 and the contact hole 40. Thus, in accordance with the aforementioned possible shortcoming of the first embodiment, leakage current flows between the bit line 14 and the semiconductor substrate 10 via the contact hole 40.

To address this shortcoming, the third embodiment of the present invention proposes a fabrication method for the memory cell so that the gap portion 56 may not be created between the trench isolation region 50 and the bit line 14, even if the region for the trench isolation region 50 and the region 52 into which ions are implanted are overlapped in a misaligned manner during exposure in a direction vertical to the bit line.

Figure 29:
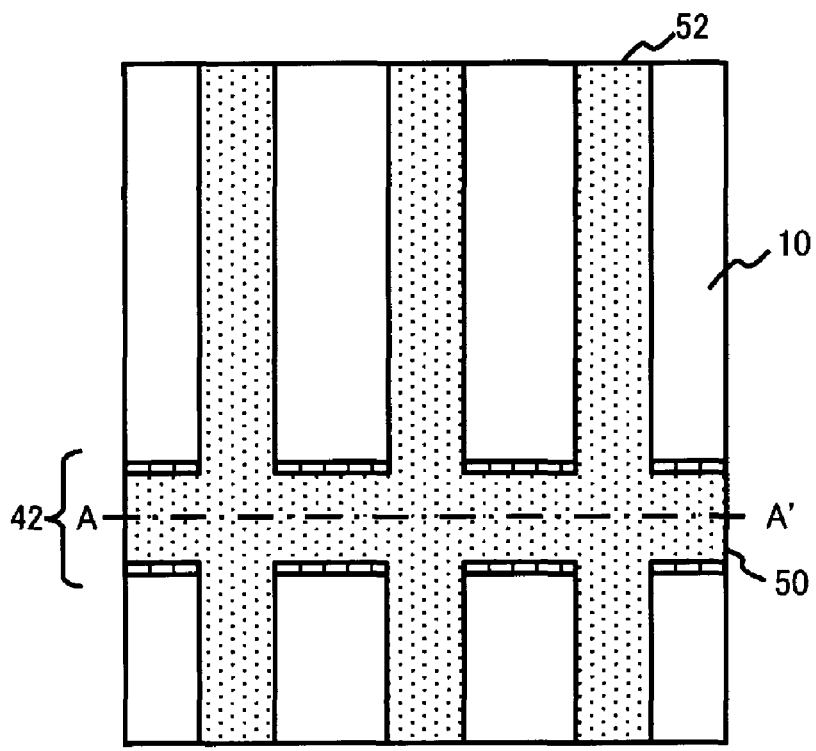
FIG. 29 shows a layout in accordance with a third embodiment of the present invention.

FIG. 29 shows a layout of the region for the trench isolation region 50 and the region 52 into which ions are implanted for forming the bit line 14 in the memory cell in accordance with the third embodiment of the present invention. The region 52 into which ions are to be implanted extends in a direction vertical to the bit line in the bit line connecting region 42.

Figure 30:
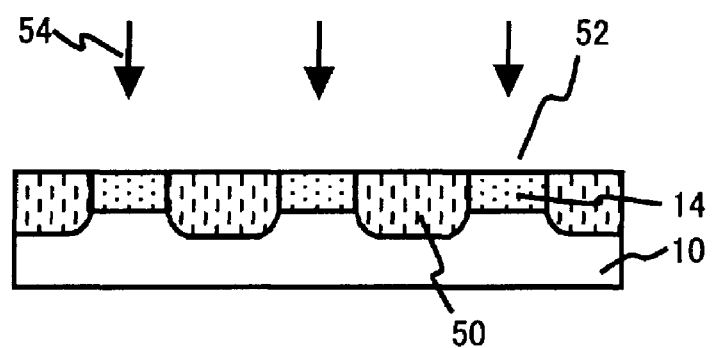
FIG. 30 is a cross-sectional view illustrating the fabrication process in accordance with the third embodiment of the present invention.

FIG. 30 is a cross-sectional view in the ion implantation process for forming the bit line 14, taken along a line A-A' shown in FIG. 29. The region 52 into which ions are implanted is continuously formed. A reference numeral 54 schematically shows the ion implantation. Arsenic, for example, is used for ion implantation. At this time, ions are also implanted into the trench isolation region 50. However, the ions implanted into the trench isolation region 50 remain in the silicon oxide film that is buried in the trench isolation region 50 and do not affect the insulating property of the trench isolation region 50. Subsequently, the N-type bit line 14 is formed by thermal treatment thereof.

The gap portion 56 is not created between the region for the trench isolation region 50 and the bit line 14, unlike the first embodiment, even if the region for the trench isolation region 50 and the region 52 into which ions are implanted are overlapped in a misaligned manner during exposure in a direction vertical to the bit line. For this reason, no leakage current flows between the bit line 14 and the semiconductor substrate 10.

Figure 31:
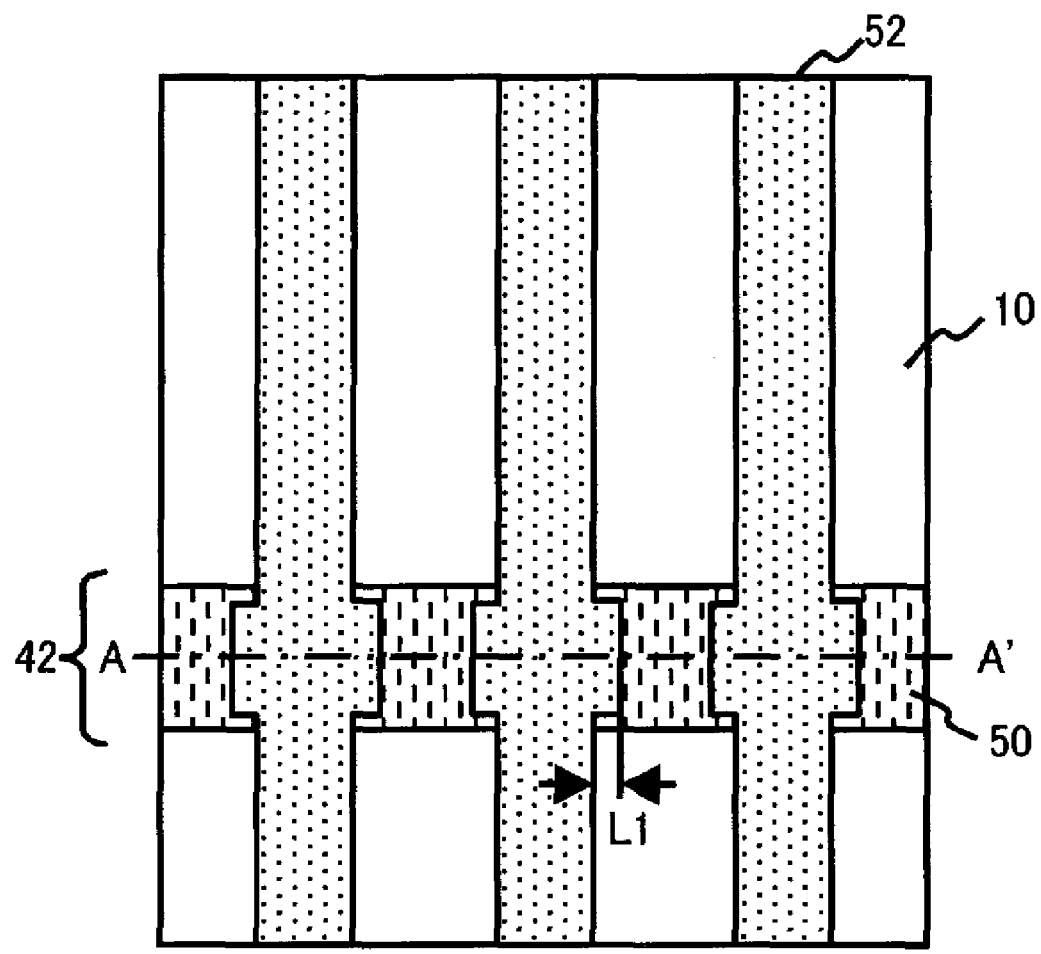
FIG. 31 is a layout showing another variation example in accordance with the third embodiment of the present invention.

As a variation example of the third embodiment, referring to FIG. 31, the region 52 into which ions are implanted to form the bit line 14 may not extend continuously in a direction vertical to the bit line in the bit line connecting region 42. If the region 52 is overlapped with the region for the trench isolation region 50, the region 52 fulfills the function thereof. Preferably, an overlapped distance L1 is formed greater than the overlapping margin of the bit line 14 and the trench isolation region 52 at the exposure.

As described above, in accordance with the third embodiment, the gap portion 56 is not created between the bit line 14 and the trench isolation region 50, even if the trench isolation region 50 and the bit line 14 are overlapped in a misaligned manner in a direction vertical to the bit line. This makes it possible to prevent leakage current from flowing between the bit line 14 and the semiconductor substrate 10.

Although a few preferred embodiments of the present invention have been shown and described, it would be appreciated by those skilled in the art that changes may be made in these embodiments without departing from the principles and spirit of the invention, the scope of which is defined in the claims below and their equivalents.

What is claimed is:

1. A semiconductor device comprising:
   a semiconductor substrate;
   a plurality of bit lines formed in first regions of the semiconductor substrate;
   an ONO film provided at a plurality of locations on the semiconductor substrate and centered above second regions of the semiconductor substrate, each of the second regions located between adjacent ones of the first regions;
   a plurality of word lines formed over portions of the ONO film; and
   one or more contacts provided on each of the plurality of bit lines and connected to the plurality of bit lines only in bit line connecting regions defined between selected pairs of adjacent ones of the plurality of word lines,
   the semiconductor substrate having trench isolation regions formed therein and provided only within the bit line connecting regions, the trench isolation regions provided at both sides of each of the plurality of bit lines within the bit line connecting regions and located adjacent to each of the one or more contacts, the one or more contacts interposed between the adjacent ones of the selected pairs of adjacent ones of the plurality of word lines, wherein the trench isolation regions are only provided between the contacts in each of the bit line connecting regions.

2. The semiconductor device as claimed in claim 1, wherein each of the plurality of bit lines contacts the trench isolation regions in the bit line connecting regions.

3. The semiconductor device as claimed in claim 1, further comprising sidewalls provided on sides of the adjacent ones of the selected pairs of adjacent ones of the plurality of word lines facing the one or more contacts.

4. The semiconductor device as claimed in claim 3, wherein each of the plurality of bit lines contacts adjacent ones of the trench isolation regions.

5. The semiconductor device as claimed in claim 3, wherein the sidewalls comprise a silicon nitride film 6. The semiconductor device as claimed in claim 5, wherein each of the plurality of bit lines contacts adjacent ones of the trench isolation regions.

7. The semiconductor device as claimed in claim 1, wherein each of the plurality of bit lines contacts adjacent ones of the trench isolation regions.

8. The semiconductor device as claimed in claim 1, wherein the selected pair of adjacent ones of the plurality of word lines are separated from other selected pairs of adjacent ones of the plurality of word lines by intervals of one or more word lines.

9. A method of fabricating a semiconductor device comprising the steps of:
   forming trench isolation regions only in predetermined bit line connecting regions in a semiconductor substrate;
   forming a plurality of bit lines in first regions of the semiconductor substrate, the first regions extending in a first direction and portions of each of the plurality of bit lines formed between the trench isolation regions, wherein the trench isolation regions are provided at both sides of each of the plurality of bit lines;
   providing an ONO film on the semiconductor substrate;
   forming a plurality of word lines on the ONO film, the plurality of word lines extending in a second direction perpendicular to the first direction, wherein the predetermined bit line connecting regions also extend in the second direction, and wherein selected pairs of adjacent ones of the plurality of word lines are formed on either side of the bit line connecting regions; and forming one or more contacts through the ONO film in the predetermined bit line connecting regions and connected to the portions of each of the plurality of bit lines formed between the trench isolation regions, wherein the trench isolation regions are only provided between the contacts in each of the bit line connecting regions.

10. The method as claimed in claim 9, further comprising:

forming sidewalls on sides of the selected pairs of adjacent ones of the plurality of word lines facing the one or more contacts.

11. The method as claimed in claim 10, wherein the step of forming the plurality of bit lines comprises a step of implanting ions in the first regions in which the plurality of bit lines are to be formed and additional regions that are located on the trench isolation regions which are adjacent to the plurality of bit lines in the predetermined bit line connecting regions.

12. The method as claimed in claim 10, wherein the step of forming sidewalls includes a step of forming sidewalls on the sides of gates in a peripheral circuit region simultaneously with forming the sidewalls provided on the sides of the selected pairs of adjacent ones of the plurality of word lines facing the one or more contacts.

13. The method as claimed in claim 12, wherein the step of forming the plurality of bit lines comprises a step of implanting ions in the first regions in which the plurality of bit lines are to be formed and additional regions that are located on the trench isolation regions which are adjacent to the plurality of bit lines in the predetermined bit line connecting regions.

14. The method as claimed in claim 13, wherein the step of forming the plurality of bit lines further comprises a step of thermal treatment of the ions implanted in the first regions in which the plurality of bit lines are to be formed to form the plurality of bit lines.

15. The method as claimed in claim 9, wherein the selected pairs of adjacent ones of the plurality of word lines are separated from other selected pairs of adjacent ones of the plurality of word lines by intervals of one or more word lines.

\* \* \* \* \*